(12) United States Patent
Bottini et al.

(10) Patent No.: US 6,194,270 B1
(45) Date of Patent: Feb. 27, 2001

(54) PROCESS FOR THE MANUFACTURING OF AN ELECTRICALLY PROGRAMMABLE NON-VOLATILE MEMORY DEVICE

(75) Inventors: Roberta Bottini, Lissone; Giovanna Dalla Libera, Monza; Bruno Vajana, Bergamo; Carlo Cremonesi, Vaprio D'Adda, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/130,720

(22) Filed: Aug. 6, 1998

(30) Foreign Application Priority Data

Aug. 7, 1997 (IT) .............................................. MI97A1902

(51) Int. Cl.⁷ .................................................. H01L 21/336
(52) U.S. Cl. ........................... 438/258; 438/264; 438/275; 438/279; 257/321
(58) Field of Search ..................................... 257/314–326; 438/258, 263, 264, 266, 591–594, 275, 279

(56) References Cited

U.S. PATENT DOCUMENTS

| | | | |
|---|---|---|---|
| 4,823,175 | * | 4/1989 | Fontana ................................ 357/23.5 |
| 5,424,232 | * | 6/1995 | Yamauchi .............................. 437/43 |
| 5,861,347 | * | 1/1999 | Maiti et al. ........................... 438/787 |

* cited by examiner

*Primary Examiner*—Charles Bowers
*Assistant Examiner*—Erik Kielin
(74) *Attorney, Agent, or Firm*—Theodore E. Galanthay; Robert Iannucci; Seed IP Law Group, PLLC

(57) ABSTRACT

Process for manufacturing an electrically programmable non-volatile memory device having electrically programmable non-volatile memory cells comprising floating-gate MOS transistors, a first kind of MOSFETs, and a second kind of MOSFETs capable of substaining gate voltages higher than that sustainable by the MOSFETs of the first kind. The process includes forming a first gate oxide layer for the floating-gate MOS transistors, a second gate oxide layer for the MOSFETs of the first kind, and a third gate oxide layer for the MOSFETs of the second kind. The first gate oxide layer further comprises a tunnel oxide region. The process provides for: forming over the surface of a semiconductor material a first layer of oxide; selectively removing the first layer of oxide from regions of said surface dedicated to the MOSFETs of the first kind, but not from the regions dedicated to the floating-gate MOS transistors nor to the MOSFETs of the second kind; forming a second layer of oxide over the first layer of oxide and over said regions dedicated to the MOSFETs of the first kind; simultaneously removing the first and the second layer of oxide only from the tunnel oxide region of the floating-gate MOS transistors; and forming over the second layer of oxide and over said tunnel region oxide for the floating-gate MOS transistors a tunnel oxide layer. The third gate oxide layer and said first gate oxide layer, except in the tunnel oxide region, are formed by the superposition of the first layer of oxide, while the second layer of oxide and the tunnel oxide layer, said second gate oxide layer being formed by the superposition of the second layer of oxide and the tunnel oxide layer.

15 Claims, 3 Drawing Sheets

PROCESS FOR THE MANUFACTURING OF AN ELECTRICALLY PROGRAMMABLE NON-VOLATILE MEMORY DEVICE

TECHNICAL FIELD

The present invention concerns a process for the manufacturing of an electrically programmable non-volatile memory device, such as a single (SP) or double (DP) polysilicon level FLOTOX (Floating-gate Tunneling Oxide) EEPROM memory. Particularly, the invention relates to the formation of tunneling areas of EEPROM memory cells.

BACKGROUND OF THE INVENTION

It is known that for the manufacturing of these memory devices it is necessary to provide for layers of different of different thickness in the active areas of the devices forming the memory cells.

For forming such oxide layers, a selective removal of the different layers that are successively grown in the active areas is necessary. To this purpose, several chemical etching processes are performed to remove the unnecessary layers from the silicon surface.

Examples of electrically programmable non-volatile memory cells are the double polysilicon level (DP) FLOTOX EEPROM memory cells, one of which is shown in FIGS. 1 and 2 and includes a floating-gate MOS transistor 2 and a selection MOSFET 3. The floating-gate MOS transistor 2 comprises an N type source region 4 and an N type drain region 5 both formed in a P type semiconductor substrate or well 6, spaced apart from each other. The portion of P type substrate or well comprised between the source and drain regions 4 and 5 forms a channel region, and a floating gate electrode 7 (formed in a first polysilicon level) is placed over the channel region and part of the drain region 5, with the interposition of a gate oxide layer 8 having typically a thickness of 200 Å. At the drain region 5, the gate oxide 8 has a thinner portion 9, with typical thickness of about 70 Å, called tunnel oxide. The drain region 5 comprises, under the tunnel oxide 9, a region 10 heavily doped of the N type. A control gate electrode 11 (formed in a second polysilicon level) is placed over the floating gate electrode 7 with the interposition of a dielectric layer 100.

The selection MOSFET 3 of each memory cell is connected in series to the respective floating-gate MOS transistor 2, and comprises an N type source region coincident with the drain region 5 of the floating-gate MOS transistor 2, and an N type drain region 12 formed in the P type substrate or well 6. The region of the substrate or well 6 comprised between the drain region 12 and the source region 5 of MOSFET 3 forms a channel region, over which two polysilicon electrodes 13, 14 are placed, forming the gate of MOSFET 3. The first electrode 13 is separated from the channel region by a gate oxide layer 80. The second electrode 14 is separated from the first electrode 13 by a dielectric layer 101.

Conventionally, as far as the selection transistors 3 are concerned, the two polysilicon electrodes 13, 14 belong to respective lines formed from the first and the second polysilicon levels, and said lines are electrically short-circuited in a region of the array not shown in FIG. 1.

The oxide layer 80 is generally thicker than the oxide layer 8 (typically the oxide layer 80 is 300 Å thick), since the former must be capable of sustaining the voltages involved in the process of programming the memory cells, voltages which are higher than the supply voltage.

With reference to FIGS. 3 to 6, the conventional process for the fabrication of an EEPROM memory device includes using FLOTOX EEPROM memory cells and MOSFETs 90 for the circuitry. The process provides for defining active areas for the memory cells and the MOSFETs of the circuitry; the formation of a sacrificial oxide layer; the implantation of an N type dopant for forming the regions 10 of the memory cells, and a thermal diffusion process for diffusing the dopant; and the subsequent removal of the sacrificial oxide.

By means of a thermal oxidation a first gate oxide layer 15 is formed, having a thickness of about 200 Å. The oxide layer 15 is formed over the active areas of both the memory cells 1 and the MOSFETs 90 of the circuitry (FIG. 3).

By means of a conventional photolithographic process, providing for the deposition of a photoresist 16 and the selective etching thereof, the first oxide layer 15 is removed from the active area region wherein the floating-gate MOSFET 2 will be formed, and from the active areas where low-voltage (LV) transistors 90 of the circuitry will be formed (FIG. 4).

By means of thermal oxidation a second gate oxide layer 800 is formed having a thickness of about 170 Å. By means of a conventional photolithographic technique, providing for the deposition of another photoresist layer 17 and the selective etching thereof, the second oxide layer 800 is selectively removed from the tunnel region of the memory cell (FIG. 5). By means of a further thermal oxidation the tunnel oxide layer 9 is formed, having a typical thickness of about 70 Å.

The memory cell 1 and the MOSFETs 90 of the circuitry are then conventionally completed by defining their gates, forming the source and drain regions, forming insulating spacers, and so on.

As it will be appreciated, the gate oxide layer 80 of the selection MOSFET 3, as well as the gate oxide layer of the high-voltage (HV) MOSFETs of the circuitry that, as the selection MOSFET 3 have to sustain the high voltages involved in the programming operation, is formed by a stack of the three oxide layers 15, 800 and 9. The gate oxide layer 8 of the floating-gate MOS transistor 2, as well as the gate oxide layer of the low-voltage (LV) MOSFETs of the circuitry is instead formed by a stack of the two oxide layers 800 and 9.

A drawback of this process is due to the fact that the surface of the silicon where the tunnel oxide 9 is grown is affected by the removal of the first and second oxide layers. The twice removal increases the probability of damaging the silicon surface, negatively affecting the reliability of the tunnel oxide subsequently grown, and thus negatively affecting the reliability of the memory device.

SUMMARY OF THE INVENTION

In view of the state of the art described, it is an object of the invention that of providing a manufacturing process overcoming the above-mentioned drawback.

According to an embodiment of the present invention, such an object is achieved by means of a process for the manufacturing of an electrically programmable non-volatile memory device comprising electrically programmable non-volatile memory cells comprising floating-gate MOS transistors, a first kind of MOSFETs, and a second kind of MOSFETs capable of sustaining gate voltages higher than sustainable by the MOSFETs of the first kind, said process providing for forming a first gate oxide layer for the floating-gate MOS transistors, a second gate oxide layer for the MOSFETs of the first kind, and a third gate oxide layer for the MOSFETs of the second kind, the first gate oxide layer further comprising a tunnel oxide region. The process includes:

forming over the surface of a semiconductor material a first layer of oxide;

selectively removing the first layer of oxide from regions of said surface dedicated to the MOSFETs of the first kind, but not from the regions dedicated to the floating-gate MOS transistors nor to the MOSFETs of the second kind;

forming a second layer of oxide over the first layer of oxide and over said regions dedicated to the MOSFETs of the first kind;

simultaneously removing the first and the second layer of oxide only from the tunnel oxide region of the floating-gate MOS transistors; and forming over the second layer of oxide and over said tunnel region oxide for the floating-gate MOS transistors a tunnel oxide layer, whereby said third gate oxide layer and said first gate oxide layer, except in the tunnel oxide region, are formed by the superposition of the first layer of oxide, the second layer of oxide and the tunnel oxide layer, said second gate oxide layer being formed by the superposition of the second layer of oxide and the tunnel oxide layer.

The process has a smaller number of phases negatively affecting the quality of the surfaces subjected to treatment. Particularly, for the formation of the tunnel region of a FLOTOX EEPROM memory cell, the silicon surface where the tunnel oxide will be formed is exposed only once to the chemical etchings for the removal of oxides. The reliability of the memory devices is thus improved. This is clearly advantageous in view of the technology trend towards memory devices having large capacity, for which it is more and more difficult to assure reliability.

BRIEF DESCRIPTION OF THE DRAWINGS

The features and advantages of the present invention will be made apparent from the following detailed description of an embodiment thereof, illustrated by way of a non-limiting example only in the annexed drawings, wherein.

DETAILED DESCRIPTION OF THE INVENTION

Figure 1:
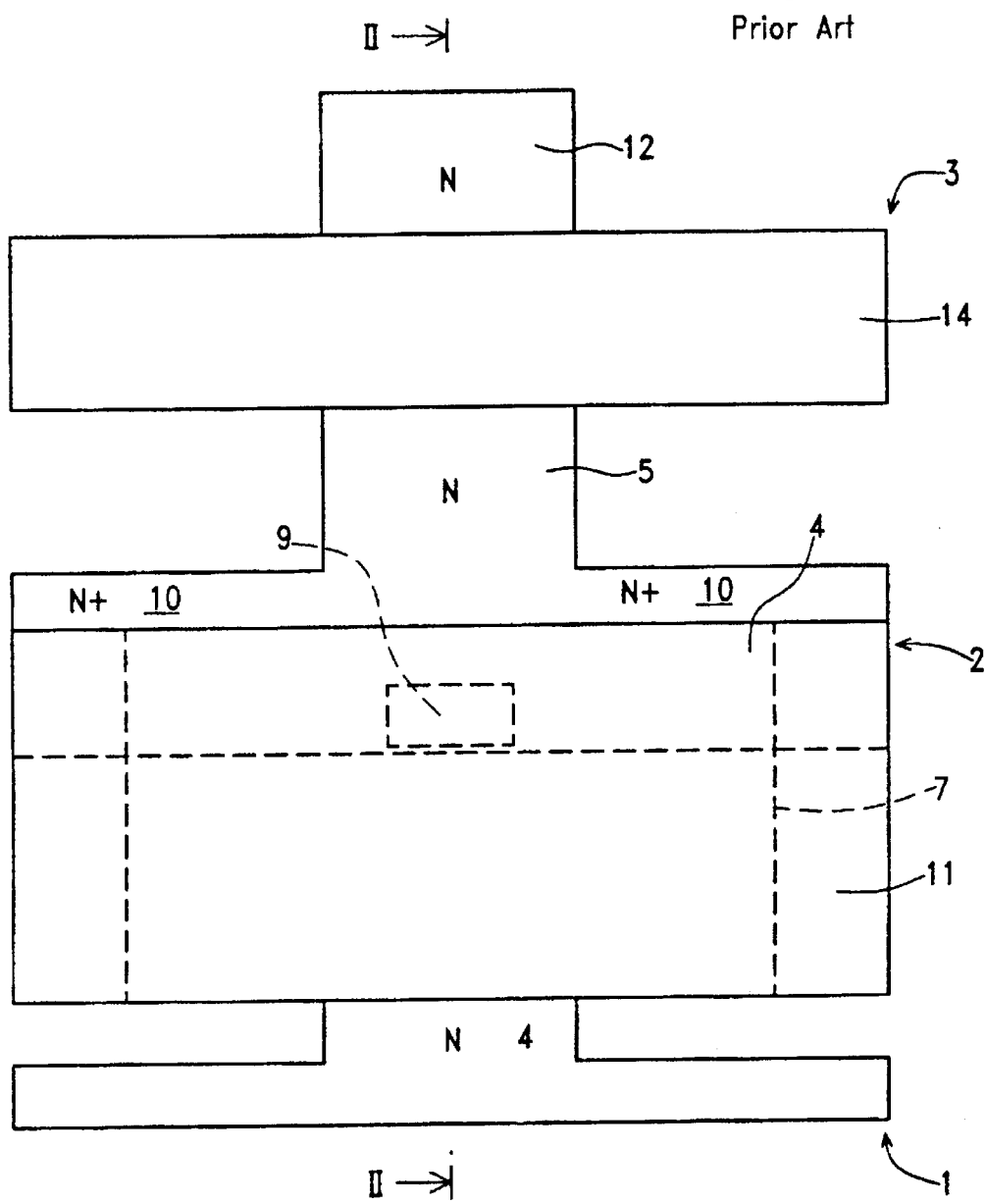
FIG. 1 is a top plan view of a conventional double polysilicon level FLOTOX EEPROM memory cell.
Figure 2:
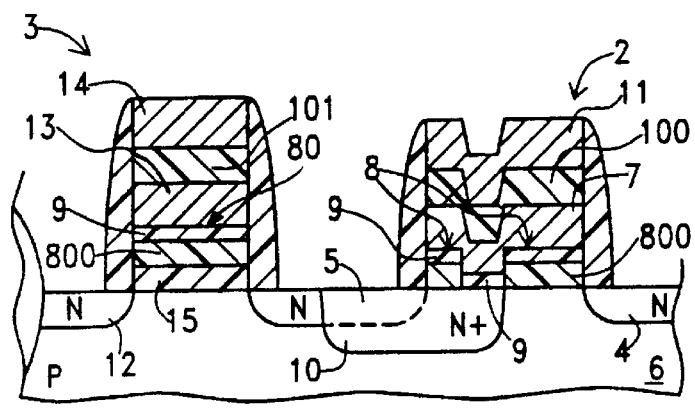
FIG. 2 is a cross-sectional view of the double polysilicon level FLOTOX EEPROM memory cell along line II—II in FIG. 1.
Figure 3:
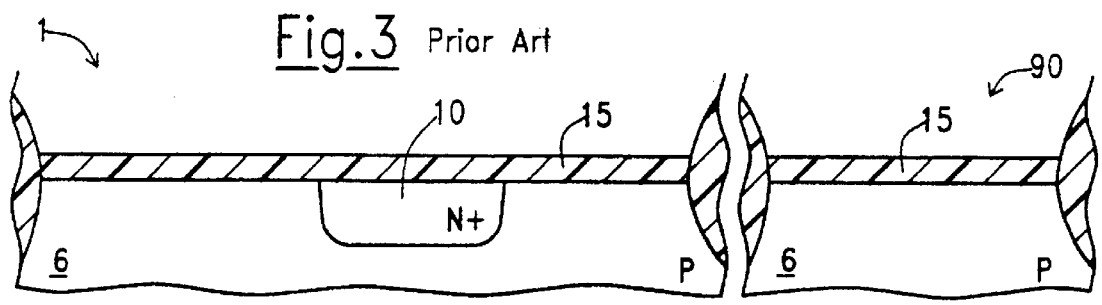
FIGS. 3 to 6 show some steps of a conventional process for the formation of an EEPROM memory cell and a MOSFET of the circuitry.
Figure 4:
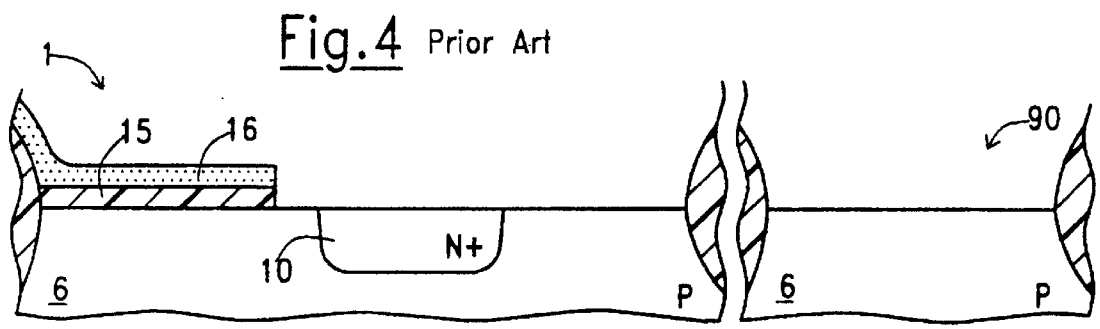
Figure 5:
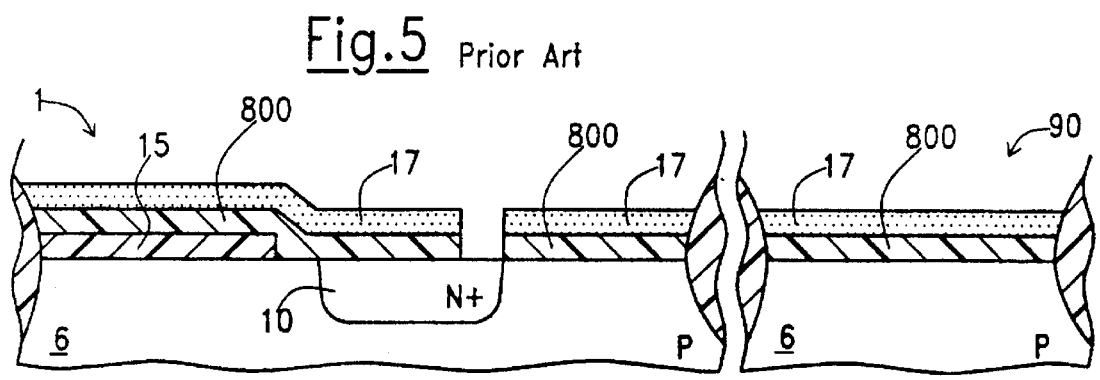
Figure 6:
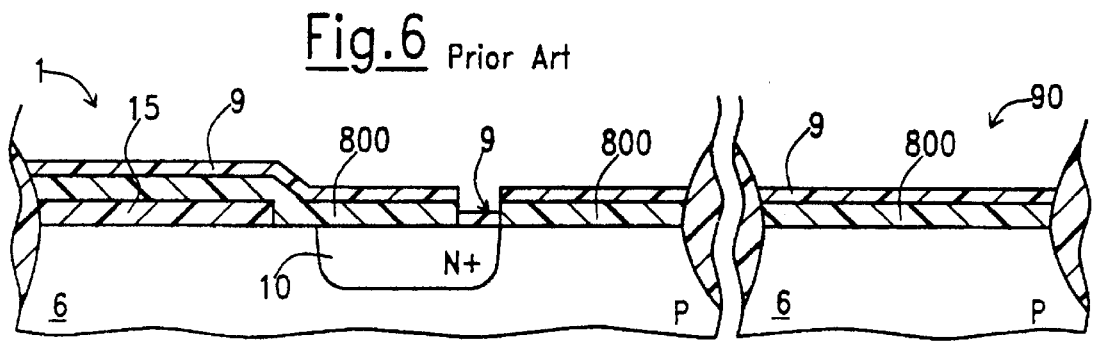

In FIGS. 7 to 11 the main steps of a process according to the invention are shown, for the fabrication of tunneling areas of FLOTOX EEPROM memory cells 40 and the transistors of the circuitry 70. Each memory cell 40 conventionally comprises a floating-gate MOS transistor 50 and a selection transistor 60.

The process according to the invention comprises, as the conventional process, the formation of active areas for the memory cells 40 and for the MOSFETs 90 of the circuitry, and the formation of N type regions 10 for the floating-gate MOS transistors 2, by means of ion implantation and subsequent diffusion.

Figure 7:
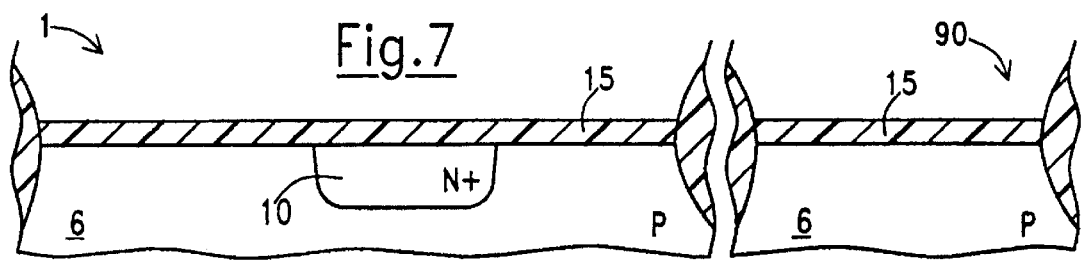
FIGS. 7 to 11 show the main steps of a process according to the invention.

Over the active areas of the cells and the MOSFETs of the circuitry there is then formed a first layer of oxide 15, having typical thickness of about 200 Å, for example formed by means of thermal oxidation (FIG. 7).

Figure 8:
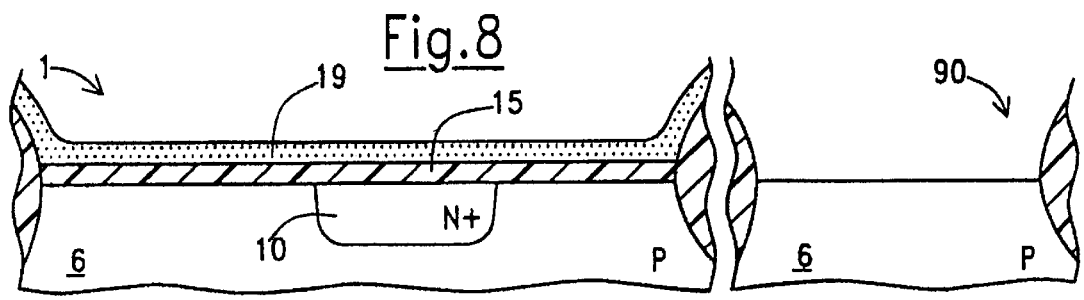

After having deposited a photoresist layer 19 and having selectively removed the same from over the active areas for the low-voltage MOSFETs LV of the circuitry, the layer of oxide 15 is selectively removed from the active area of the MOSFETs 90 of the circuitry (FIG. 8). Thus, differently from the conventional process, the first layer of oxide 15 is left over the whole active area for the memory cells.

Figure 9:
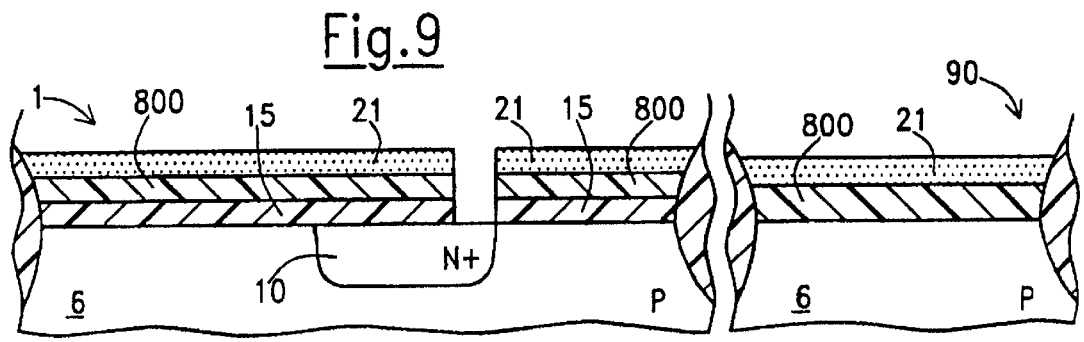
Figure 10:
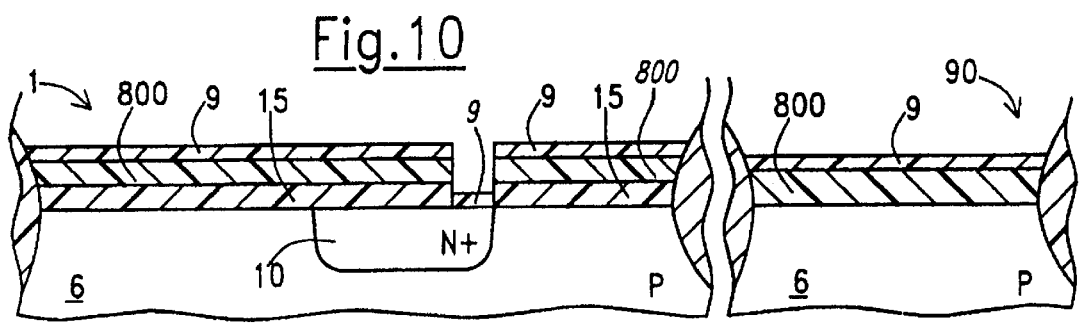
Figure 11:
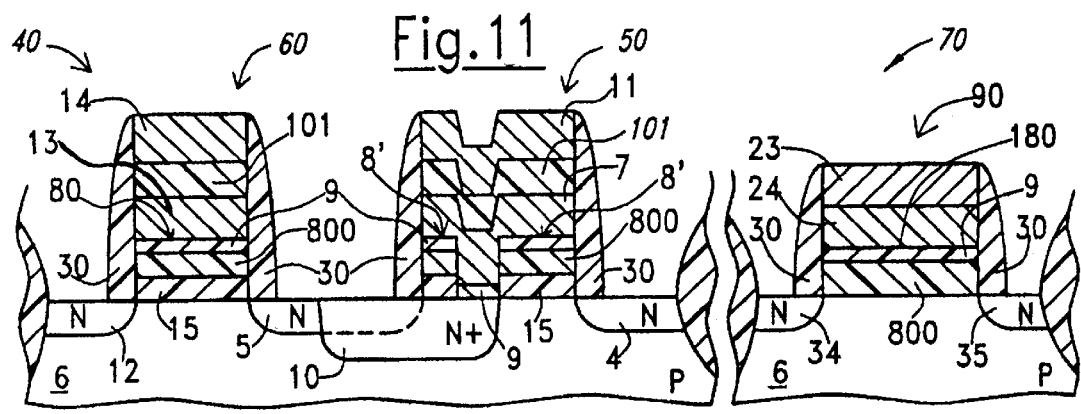

A second layer of oxide 800 is then formed, having a thickness of about 170 Å. After having deposited and selectively removed a photoresist layer 21 in order to expose the tunnel oxide regions of the memory cells, the first and the second layers of oxide 15, 800 are selectively removed from such tunnel regions (FIG. 9).

The tunnel oxide layer 9 is then formed, having a typical thickness of about 70 Å.

Similarly to the conventional process, the MOSFET 90 has its gate oxide formed by the superposition of the oxide layers 800 and 9.

As is clearly apparent, in the process according to the illustrated embodiment of the invention, the regions of the surface of the silicon layer 6 which are to be covered solely by the tunnel oxide layer 9 undergo only one etching process. This means a lower defectiveness of the tunnel oxide of the memory cells, and thus a higher reliability of the same.

In the following steps of the process, a first level of polysilicon is deposited. From the first level of polysilicon, the first level 13 of the gate electrode of the selection MOSFET 60, the floating gate 7 of the floating-gate MOS transistor 50, and a first level 24 of the gate electrode of the transistors of the circuitry are formed.

An intermediate dielectric layer 101 is then formed over the whole surface of the chip; the intermediate dielectric layer is completely removed from the regions where the transistors 90 of the circuitry will be formed.

A second level of polysilicon is then deposited. From the second level of polysilicon, the control gate 11 of the floating-gate MOS transistor 50, the second level 14 of the gate electrode of the selection MOSFET 60, and a second level 23 of the gate electrode of the transistors 90 of the circuitry are formed.

Convention steps provide for the formation of spacers 30, the formation of source and drain regions 4, 5, 12, 34 and 35 of the memory cells 40 and the MOSFET of the circuitry 90, the formation of contacts, the formation of metal interconnection lines, and the final passivation of the whole memory cell array.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing an electrically programmable non-volatile memory device including a first MOSFET and an electrically programmable non-volatile memory cell having a floating-gate MOS transistor and a second MOSFET capable of sustaining gate voltages higher than sustainable by the first MOSFET, said process comprising:

forming a first gate oxide layer for the floating-gate MOS transistor, a second gate oxide layer for the first MOSFET, and a third gate oxide layer for the second MOSFET, the first gate oxide layer including a tunnel oxide region;

forming over a surface of a semiconductor material a first layer of oxide;

selectively removing the first layer of oxide from a region of said surface dedicated to the first MOSFET, but not from regions dedicated to the floating-gate MOS transistor or the second MOSFET;

forming a second layer of oxide over the first layer of oxide and over said region dedicated to the first MOSFET;

removing the first and the second layer of oxide only from the tunnel oxide region of the floating-gate MOS transistor; and forming over the second layer of oxide and over said tunnel region oxide for the floating-gate MOS transistor a tunnel oxide layer, wherein said third gate oxide layer and said first oxide later, except in the tunnel oxide region, are formed by the superposition of the first layer of oxide, the second layer of oxide and the tunnel oxide layer, said second gate oxide layer being formed by the superposition of the second layer of oxide and the tunnel oxide later.

2. The process according to claim 1, wherein said second MOSFET is a selection MOSFET.

3. The process according to claim 2, wherein said memory cell is an EEPROM memory cell.

4. The process according to claim 3, wherein said EEPROM memory cell is a FLOTOX cell.

5. The process according to claim 4, wherein said first and second layers of oxide and said tunnel oxide layer are formed by means of thermal oxidation.

6. The process of claim 1, further comprising forming respective drain and source regions of each of the first and second MOSFETs and the floating-gate MOS transistor, thereby defining three channel regions of the first and second MOSFETs and the floating-gate MOS transistor, respectively.

7. The process according to claim 1, wherein said first layer of oxide has a thickness of about 200 Å, said second layer of oxide has a thickness of about 170 Å, and said tunnel oxide layer has a thickness of about 70 Å.

8. A process for manufacturing an electrically programmable non-volatile memory device having an electrically programmable non-volatile memory cell, the process comprising:

forming a first layer of oxide on a semiconductor substrate, the substrate having a first region for a first transistor, a second region for a second transistor, and a third region for a third transistor;

selectively removing the first layer of oxide from the third region without removing the first layer of oxide from the first and second regions;

forming a second layer of oxide over the third region and over the first layer of oxide;

forming a gap through the first and second layers of oxide at the second region; and forming a third layer of oxide over the second layer of oxide, the third layer of oxide including a tunnel oxide layer formed in the gap, the tunnel oxide layer being a tunnel oxide layer of a floating gate of the second transistor; the first, second, and third layers of oxide over the first region forming a gate oxide of the first transistor; and the second and third layers of oxide over the third region forming a gate oxide of the third transistor.

9. The process of claim 8 wherein the acts of forming the first, second, and third layers of oxide include forming the first, second, and third layers of oxide layers by thermal oxidation.

10. The process according to claim 8 wherein the first layer of oxide has a thickness of about 200 Å, the second layer of oxide has a thickness of about 170 Å, and the third layer of oxide has a thickness of about 70 Å.

11. The process according to claim 8 wherein the first, second, and third layers of oxide form a first gate oxide layer at the first region and a second gate oxide layer at the second region and the second and third layers of oxide form a third gate oxide layer at the third region, the first and second gate oxide layers each have a thickness of about 300 Å, the third gate oxide layer has a thickness of about 200 Å, and the tunnel oxide layer has a thickness of about 70 Å.

12. The process according to claim 8, further comprising forming the second transistor as a floating gate memory cell and forming the first transistor as a selection transistor for programming the floating gate memory cell.

13. The process according to claim 8 wherein the first, second, and third layers of oxide form a first gate oxide layer at the first region and a second gate oxide layer at the second region and the second and third layers of oxide form a third gate oxide layer at the third region, the process further comprising:

depositing a conductive layer on the first, second, and third gate oxide layers; and removing portions of the conductive layer and thereby form the conductive layer into a first gate electrode for the first transistor, a second gate electrode for the second transistor, and a third gate electrode for the third transistor.

14. The process of claim 8, further comprising forming a common doped region in the semiconductor substrate adjacent to the first and second regions, the common doped region being a source region for the first transistor and a drain region for the second transistor and enabling the first transistor to act as a selection transistor for the second transistor.

15. The process of claim 8, further comprising forming respective drain and source regions of each of the first, second, and third transistors, thereby defining three channel regions of the first, second, and third transistors, respectively.

* * * * *

UNITED STATES PATENT AND TRADEMARK OFFICE
CERTIFICATE OF CORRECTION

PATENT NO. : 6,194,270 B1
DATED : February 27, 2001
INVENTOR(S) : Roberta Bottini et al.

It is certified that error appears in the above-identified patent and that said Letters Patent is hereby corrected as shown below:

<u>Title page,</u>
Item [30], the Foreign Priority Application number should read -- MI97A 001902 --.

<u>Column 5, claim 1,</u>
Line 31, "the tunnel oxide later" should read -- the tunnel oxide layer --.

Signed and Sealed this

Nineteenth Day of March, 2002

Attest:

JAMES E. ROGAN
*Director of the United States Patent and Trademark Office*

*Attesting Officer*